United States Patent
Lim et al.

(10) Patent No.: US 12,419,035 B2
(45) Date of Patent: Sep. 16, 2025

(54) SEMICONDUCTOR DEVICES HAVING HIGHLY INTEGRATED CAPACITORS THEREIN

(71) Applicant: Samsung Electronics Co., Ltd., Suwon-si (KR)

(72) Inventors: Jung-Bum Lim, Seongnam-si (KR); Seungjin Kim, Hwaseong-si (KR); Sangchul Yang, Hwaseong-si (KR); Jeon Il Lee, Suwon-si (KR); Hoin Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 612 days.

(21) Appl. No.: 17/820,231

(22) Filed: Aug. 16, 2022

(65) Prior Publication Data

US 2023/0217646 A1     Jul. 6, 2023

(30) Foreign Application Priority Data

Jan. 6, 2022  (KR) .................. 10-2022-0002287

(51) Int. Cl.
*H10B 12/00* (2023.01)
*H10D 1/00* (2025.01)
*H10D 1/68* (2025.01)

(52) U.S. Cl.
CPC .......... *H10B 12/315* (2023.02); *H10D 1/042* (2025.01); *H10D 1/043* (2025.01); *H10D 1/716* (2025.01); *H10B 12/0335* (2023.02); *H10D 1/696* (2025.01)

(58) Field of Classification Search
CPC .............. H10B 12/315; H10B 12/0335; H10B 12/033; H10B 12/318; H10D 1/716; H10D 1/696; H10D 1/692; H01L 23/5283
See application file for complete search history.

(56) References Cited

U.S. PATENT DOCUMENTS

| | | |
|---|---|---|
| 7,749,895 B2 | 7/2010 | Kong |
| 7,897,474 B2 | 3/2011 | Eto |
| 8,154,064 B2 | 4/2012 | Manning et al. |
| 8,704,283 B2 | 4/2014 | Kim et al. |
| 9,601,494 B2 | 3/2017 | Kim et al. |
| 10,559,651 B2 | 2/2020 | Chang et al. |
| 10,903,310 B2 | 1/2021 | Lee et al. |
| 11,031,460 B2 | 6/2021 | Kang et al. |
| 11,107,879 B2 | 8/2021 | Huang et al. |
| 2015/0325636 A1 | 11/2015 | Otsuka |
| 2021/0036101 A1 | 2/2021 | Choi et al. |
| 2021/0151439 A1 | 5/2021 | Choi et al. |
| 2021/0202490 A1 | 7/2021 | Cho et al. |

FOREIGN PATENT DOCUMENTS

| | | |
|---|---|---|
| CN | 110970401 A | 4/2020 |
| KR | 20090105152 A | 10/2009 |
| KR | 20130041522 A | 4/2013 |

*Primary Examiner* — Samuel A Gebremariam
(74) *Attorney, Agent, or Firm* — Wolf, Greenfield & Sacks, P.C.

(57) ABSTRACT

A semiconductor device includes a vertical stack of ring-shaped electrodes that are electrically connected together into a top electrode of a capacitor, on a semiconductor substrate. A bottom electrode of the capacitor is also provided, which extends vertically in a direction orthogonal to a surface of the substrate and through centers of the vertical stack of ring-shaped electrodes. An electrically insulating bottom supporting pattern is provided, which extends between a lowermost one of the ring-shaped electrodes and an intermediate one of the ring-shaped electrodes.

20 Claims, 13 Drawing Sheets

SEMICONDUCTOR DEVICES HAVING HIGHLY INTEGRATED CAPACITORS THEREIN

REFERENCE TO PRIORITY APPLICATION

This U.S. non-provisional patent application claims priority under 35 U.S.C. § 119 to Korean Patent Application No. 10-2022-0002287, filed Jan. 6, 2022, the disclosure of which is hereby incorporated herein by reference.

BACKGROUND

The present disclosure relates to semiconductor devices and, in particular, to semiconductor memory devices having capacitors therein and methods of fabricating the same.

Due to their small-size, multifunctional, and/or low-cost characteristics, semiconductor devices are being considered as important elements in the electronics industry. Semiconductor devices are often classified into semiconductor memory devices for storing data, semiconductor logic devices for processing data, and hybrid semiconductor devices having both memory and logic elements therein.

With the recent trend in high speed and low power consumption within electronic devices, semiconductor devices are also required to have high operating speeds and/or low operating voltages. In order to satisfy these requirements, it is often necessary to increase an integration density of the semiconductor devices. However, as the integration density of the semiconductor device increases, the semiconductor devices may suffer from deterioration in electrical characteristics and production yield. Accordingly, many research studies are being conducted to improve the electrical characteristics and production yield of higher performance semiconductor devices.

SUMMARY

An embodiment of the inventive concept provides semiconductor devices with improved electrical and reliability characteristics, and methods of fabricating the same.

According to an embodiment of the inventive concept, a semiconductor device may include: (i) bottom electrodes on a substrate, (ii) a bottom supporting pattern provided between the bottom electrodes, (iii) a top supporting pattern on the bottom electrodes, (iv) a top electrode covering the bottom electrodes, the bottom supporting pattern, and the top supporting pattern, and (v) a dielectric layer interposed between the bottom electrodes and the top electrode, between the bottom supporting pattern and the top electrode, and between the top supporting pattern and the top electrode. The top supporting pattern may include a first portion, which is provided on top surfaces of the bottom electrodes, and a second portion, which is provided to fill an internal space of each of the bottom electrodes.

According to another embodiment of the inventive concept, a semiconductor device may include: (i) bottom electrodes on a substrate, (ii) a bottom supporting pattern provided between the bottom electrodes, (iii) a top supporting pattern on the bottom electrodes, (iv) a top electrode covering the bottom electrodes, the bottom supporting pattern, and the top supporting pattern, and (v) a dielectric layer extending between the bottom electrodes and the top electrode, between the bottom supporting pattern and the top electrode, and between the top supporting pattern and the top electrode. Each of the bottom electrodes may include a horizontal portion and a vertical portion, which is vertically extended from the horizontal portion. The horizontal portion and the vertical portion may define an internal space of each of the bottom electrodes, and the top supporting pattern may cover top surfaces of the bottom electrodes. At least a portion of the top supporting pattern may further extend into the internal space of each of the bottom electrodes.

According to another embodiment of the inventive concept, a semiconductor device may include a substrate having an active pattern therein, and an impurity region within the active pattern. A word line extends across cross the active pattern, and a bit line extends in a direction crossing the word line. A storage node contact is provided on the substrate, and is electrically connected to the impurity region. A landing pad is provided, which is electrically connected to the storage node contact. A bottom electrode is provided, which is electrically connected to the landing pad. A bottom supporting pattern and a top supporting pattern are provided between the bottom electrode and another bottom electrode adjacent thereto, when viewed from a plan perspective. A top electrode is provided, which covers the bottom electrode, the bottom supporting pattern, and the top supporting pattern. A dielectric layer is provided, which extends between the bottom electrode and the top electrode, between the bottom supporting pattern and the top electrode, and between the top supporting pattern and the top electrode. The top supporting pattern includes a first portion on a top surface of the bottom electrode, and a second portion that fills an internal space within the bottom electrode.

According to a further embodiment of the inventive concept, a semiconductor device is provided, which includes a vertical stack of ring-shaped electrodes that are electrically connected together into a top electrode of a capacitor, on a semiconductor substrate. A bottom electrode of the capacitor is provided, which extends vertically in a direction orthogonal to a surface of the substrate and through centers of the vertical stack of ring-shaped electrodes. An electrically insulating bottom supporting pattern is provided, which extends between a lowermost one of the ring-shaped electrodes and an intermediate one of the ring-shaped electrodes.

An additional embodiment of the inventive concept includes an integrated circuit memory device having a semiconductor substrate, and a capacitor on the substrate. The capacitor includes: (i) a top electrode defined by at least two vertically-stacked ring-shaped electrodes, (ii) a bottom electrode extending vertically in a direction orthogonal to a surface of the substrate and through centers of the at least two vertically-stacked ring-shaped electrodes, and (iii) a dielectric material extending between the bottom electrode and the at least two vertically-stacked ring-shaped electrodes.

DETAILED DESCRIPTION

Example embodiments of the inventive concepts will now be described more fully with reference to the accompanying drawings, in which example embodiments are shown.

Figure 1:
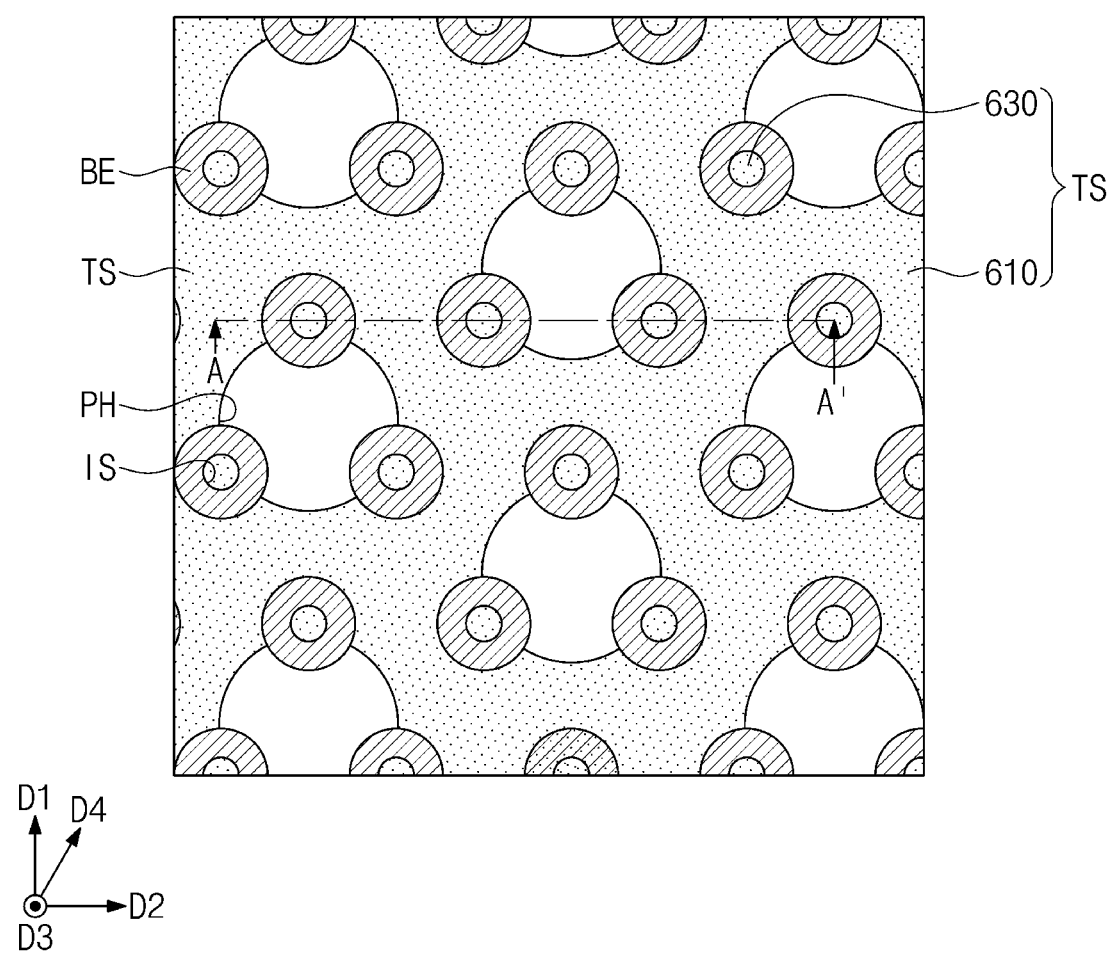
FIG. 1 is a plan view illustrating a semiconductor device according to an embodiment of the inventive concept.
Figure 2:
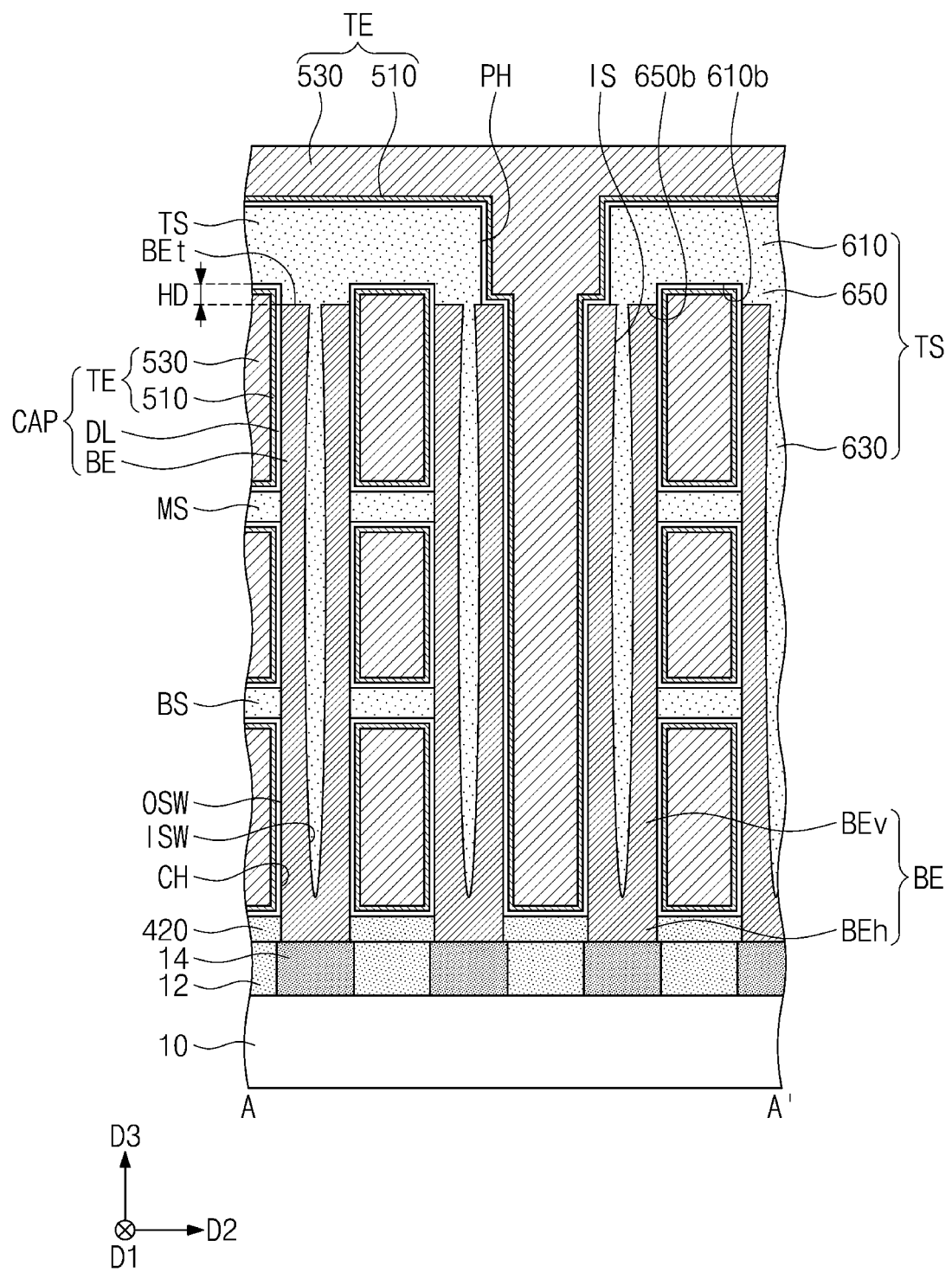
FIGS. 2, 3, and 4 are sectional views, each of which is taken along a line A-A' of FIG. 1 to illustrate a semiconductor device according to an embodiment of the inventive concept.

FIG. 1 is a plan view illustrating a semiconductor device according to an embodiment of the inventive concept. FIG. 2 is a sectional view, which is taken along a line A-A' of FIG. 1 to illustrate a semiconductor device according to an embodiment of the inventive concept. Referring to FIGS. 1 and 2, a substrate 10, such as a semiconductor or semiconductor-on-insulator (SOI) substrate, may be provided. In some embodiments, the substrate 10 may be a silicon substrate, a germanium substrate, or a silicon-germanium substrate. The substrate 10 may have a top surface that is parallel to a first direction D1 and a second direction D2, and is perpendicular to a third direction D3. In an embodiment, the first to third directions D1, D2, and D3 may be orthogonal to each other.

An interlayer insulating layer 12 may be provided on the substrate 10. The interlayer insulating layer 12 may cover at least a portion of a top surface of the substrate 10. The interlayer insulating layer 12 may be formed of or include at least one of silicon nitride, silicon oxide, or silicon oxynitride. In an embodiment, the interlayer insulating layer 12 may be an empty region.

Conductive contacts 14 may be provided in the interlayer insulating layer 12. The conductive contacts 14 may be spaced apart from each other in the first and second directions D1 and D2. The conductive contacts 14 may be formed of or include at least one of, for example, doped semiconductor materials (e.g., poly silicon), metal-semiconductor compounds (e.g., tungsten silicide), metal nitride materials (e.g., titanium nitride, tantalum nitride, and tungsten nitride), or metallic materials (e.g., titanium, tungsten, and tantalum). The conductive contacts 14 may be electrically connected to impurity regions (e.g., source/drain terminals) that are formed in the substrate 10.

An etch stop pattern 420 may be provided on the interlayer insulating layer 12. The etch stop pattern 420 may be formed to cover the interlayer insulating layer 12 and to expose the conductive contacts 14. In an embodiment, the etch stop pattern 420 may be formed of or include at least one of silicon oxide, SiCN, or SiBN.

Bottom electrodes BE may be provided in conductive contact holes CH, which are defined on the conductive contacts 14. Each of the bottom electrodes BE may be provided to penetrate the etch stop pattern 420 and may be electrically connected to the conductive contacts 14, respectively. As a height in the third direction D3 increases, a width of each of the bottom electrodes BE may increase. The bottom electrodes BE may be formed of or include at least one of conductive materials. For example, the bottom electrodes BE may be formed of or include at least one of metallic materials (e.g., cobalt, titanium, nickel, tungsten, and molybdenum), metal nitride materials (e.g., titanium nitride (TiN), titanium silicon nitride (TiSiN), titanium aluminum nitride (TiAlN), tantalum aluminum nitride (TaAlN), and tungsten nitride (WN)), precious metals (e.g., platinum (Pt), ruthenium (Ru), and iridium (Ir)), conductive oxide materials (e.g., PtO, $RuO_2$, $IrO_2$, SRO ($SrRuO_3$), BSRO (($Ba,Sr$)$RuO_3$), CRO ($CaRuO_3$), and LSCo), or metal silicide materials.

The bottom electrodes BE may be spaced apart from each other in the first and second directions D1 and D2. When viewed in the plan view of FIG. 1, the bottom electrodes BE may be arranged to form a honeycomb shape. In detail, each of the bottom electrodes BE may be placed at the center of a hexagon defined by six other bottom electrodes BE.

Each of the bottom electrodes BE may include a horizontal portion BEh, which is in contact with one of the conductive contacts 14, and a vertical portion BEv, which is extended from the horizontal portion BEh in the third direction D3. The horizontal portion BEh may be located at a level lower than a bottom supporting pattern BS. The horizontal portion BEh and the vertical portion BEv may define an internal space IS of each of the bottom electrodes BE. As a height in the third direction D3 (i.e., a distance from the substrate 10) increases, a width of the internal space IS of each of the bottom electrodes BE may increase and then decrease. A top surface BEt of each of the bottom electrodes BE may have a doughnut shape.

A bottom supporting pattern BS, a middle supporting pattern MS, and a top supporting pattern TS may be provided on the substrate 10. The bottom and middle supporting patterns BS and MS may be spaced apart from each other in the third direction D3. The middle and top supporting patterns MS and TS may be spaced apart from each other in the third direction D3. The middle supporting pattern MS may be provided between the bottom and top supporting patterns BS and TS. The bottom and middle supporting patterns BS and MS may be provided between the bottom electrodes BE. The bottom and middle supporting patterns BS and MS may enclose an outer sidewall OSW of each of the bottom electrodes BE, while being in contact with the outer sidewall OSW. The top supporting pattern TS may cover the top surface BEt of each of the bottom electrodes BE. The bottom, middle, and top supporting patterns BS, MS, and TS may be used to mechanically support the bottom electrodes BE. The bottom, middle, and top supporting patterns BS, MS, and TS may be formed of or include at least one of silicon nitride, SiBN, or SiCN. In an embodiment, additional supporting patterns may be further provided to be spaced apart from each of the bottom, middle, and top supporting patterns BS, MS, and TS in the third direction D3. In this case, the uppermost one of the supporting patterns may be referred to as the top supporting pattern TS.

The top supporting pattern TS may include a first portion 610 on the top surface BEt of each of the bottom electrodes BE, a second portion 630 filling the internal space IS of each of the bottom electrodes BE, and a third portion 650 between the first portion 610 and the second portion 630. The first portion 610 may be provided to enclose penetration holes PH, which will be described below. A thickness of the first portion 610 in the third direction D3 may be larger than a thickness of the third portion 650 in the third direction D3. The thickness of the first portion 610 in the third direction D3 may be larger than a thickness of each of the middle and bottom supporting patterns MS and BS in the third direction D3. The second portion 630 may support each of the bottom electrodes BE mechanically, while being in contact with an inner sidewall ISW of each of the bottom electrodes BE. As a height in the third direction D3 increases, a width of the second portion 630 may increase and then decrease. The second portion 630 may be overlapped with the bottom and middle supporting patterns BS and MS in a horizontal direction (e.g., in the first and second directions D1 and D2). The third portion 650 may connect the first portion 610 to the second portion 630. The third portion 650 may have a side surface which is aligned to the outer sidewall OSW of each of the bottom electrodes BE. A width of the third portion 650 may be smaller than or equal to an upper width of each of the bottom electrodes BE.

A bottom surface 610b of the first portion 610 of the top supporting pattern TS may be spaced apart from the top surface BEt of each of the bottom electrodes BE in the third direction D3. In other words, the bottom surface 610b of the first portion 610 of the top supporting pattern TS may be located at a level higher than the top surface BEt of each of the bottom electrodes BE. The top surface BEt of each of the bottom electrodes BE may be located at a level higher than a top surface of the middle supporting pattern MS. The top surface BEt of each of the bottom electrodes BE may be located at substantially the same level as a bottom surface 650b of the third portion 650 of the top supporting pattern TS. In an embodiment, the bottom surface 610b of the first portion 610 of the top supporting pattern TS may be spaced apart from the top surface BEt of each of the bottom electrodes BE by a height difference HD ranging from about 10 Å to about 150 Å.

In the semiconductor device according to an embodiment of the inventive concept, the penetration holes PH may be provided to penetrate the first portion 610 of the top supporting pattern TS and the middle and bottom supporting patterns MS and BS and to expose the etch stop pattern 420. Each of the penetration holes PH may be placed between adjacent ones of the bottom electrodes BE. Each of the penetration holes PH may be placed between three adjacent ones of the bottom electrodes BE. Each of the penetration holes PH may have a circular top surface. However, the inventive concept is not limited to this example, and the shape of the top surface of each of the penetration holes PH and the number of the bottom electrodes BE disposed around each of the penetration holes PH may be variously changed.

A dielectric layer DL may be provided on the bottom supporting pattern BS, the middle supporting pattern MS, the top supporting pattern TS, and the etch stop pattern 420. The dielectric layer DL may conformally cover top and bottom surfaces of the bottom supporting pattern BS, top and bottom surfaces of the middle supporting pattern MS, top, bottom, and side surfaces of the top supporting pattern TS, a top surface of the etch stop pattern 420, and the outer sidewall OSW of each of the bottom electrodes BE. The dielectric layer DL may fill at least a portion of the penetration holes PH. The dielectric layer DL, which is in contact with the outer sidewall OSW of the bottom electrodes BE, may have the same crystal structure as that of the bottom electrodes BE. For example, the dielectric layer DL may have a tetragonal structure. The dielectric layer DL may be formed of or include at least one of metal oxide materials (e.g., $HfO_2$, $ZrO_2$, $Al_2O_3$, $La_2O_3$, $Ta_2O_3$, and $TiO_2$) or perovskite dielectric materials (e.g., $SrTiO_3$ (STO), (Ba,Sr)$TiO_3$ (BST), $BaTiO_3$, PZT, and PLZT) and may have a single- or multi-layered structure.

A top electrode TE may be provided on the dielectric layer DL. The top electrode TE may include a barrier layer 510, which is provided to conformally cover the dielectric layer DL, and a conductive layer 530, which is provided to cover the barrier layer 510. The barrier layer 510 may be formed of or include at least one of metal nitride materials (e.g., titanium nitride, tantalum nitride, and tungsten nitride). The conductive layer 530 may be formed of or include at least one of doped poly silicon or doped silicon-germanium.

The top electrode TE may fill an internal space of each of the penetration holes PH, a space between the etch stop pattern 420 and the bottom supporting pattern BS, a space between the bottom and middle supporting patterns BS and MS, and a space between the middle and top supporting patterns MS and TS. The dielectric layer DL may be interposed between the outer sidewall OSW of the bottom electrodes BE and the top electrode TE, between the bottom supporting pattern BS and the top electrode TE, between the middle supporting pattern MS and the top electrode TE, and between the top supporting pattern TS and the top electrode TE.

The bottom electrodes BE, the dielectric layer DL, and the top electrode TE may constitute a capacitor CAP. As an example, in the case where the semiconductor device is a memory device, the capacitor CAP may be used as a data storage element of each memory cell.

Figure 3:
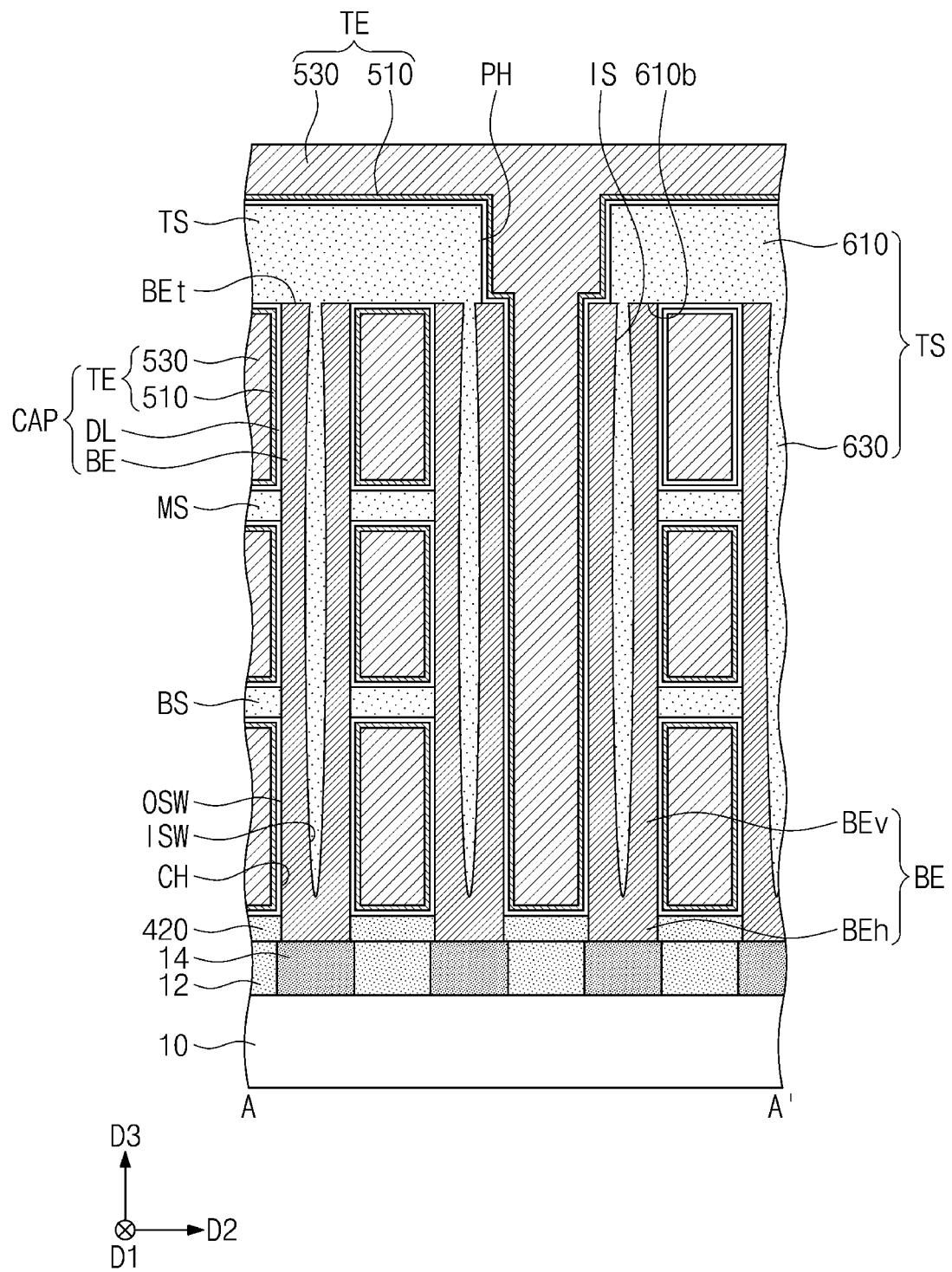

FIG. 3 is a sectional view, which is taken along the line A-A' of FIG. 1 to illustrate a semiconductor device according to another embodiment of the inventive concept. In the following description, an element previously described with reference to FIGS. 1 and 2 may be identified by the same reference number without repeating an overlapping description thereof, for concise description.

Referring to FIGS. 1 and 3, the top surface BEt of each of the bottom electrodes BE may be located at substantially the same level as the bottom surface 610b of the first portion 610 of the top supporting pattern TS (i.e., a top surface of the second portion 630 of the top supporting pattern TS). In an embodiment, the top surface BEt of each of the bottom electrodes BE and the bottom surface 610b of the first portion 610 of the top supporting pattern TS may be located at two different levels, but a height difference therebetween may be less than about 10 Å. Thus, the third portion 650 described with reference to FIGS. 1 and 2 may be omitted from the top supporting pattern TS, and thus, the top supporting pattern TS may be composed of only the first portion 610 and the second portion 630 connected thereto.

Figure 4:
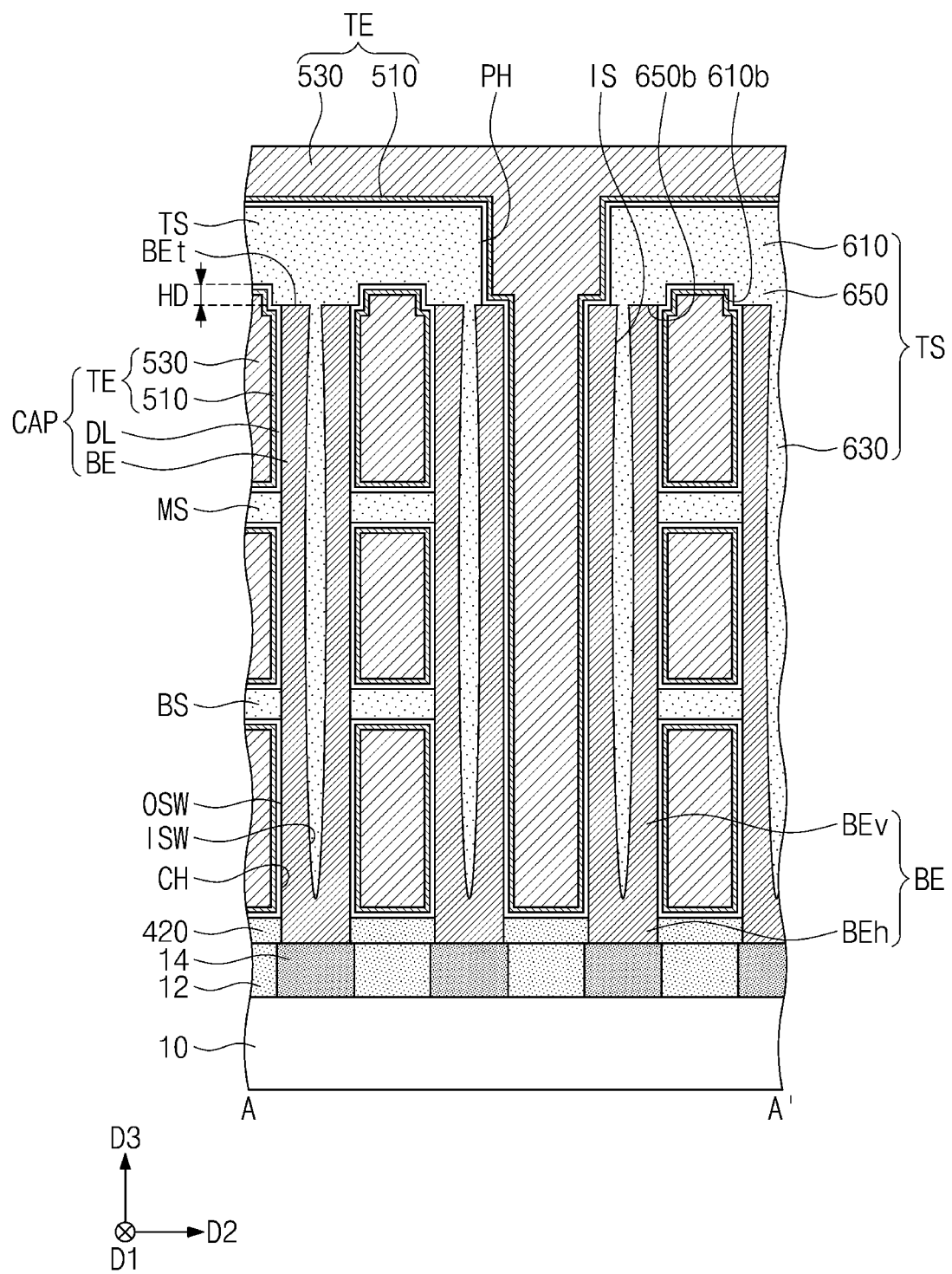

FIG. 4 is a sectional view, which is taken along the line A-A' of FIG. 1 to illustrate a semiconductor device according to another embodiment of the inventive concept. In the following description, an element previously described with reference to FIGS. 1 and 2 may be identified by the same reference number without repeating an overlapping description thereof, for concise description.

Referring to FIGS. 1 and 4, a width of the third portion 650 of the top supporting pattern TS, which is spaced apart from each of the penetration holes PH, may be larger than the upper width of each of the bottom electrodes BE. The third portion 650 of the top supporting pattern TS may have a side surface that is not aligned to the outer sidewall OSW of each of the bottom electrodes BE or is spaced apart from the outer sidewall OSW. The bottom surface 650b of the third portion 650 of the top supporting pattern TS may be in contact with the top surface BEt of each of the bottom electrodes BE and may be extended from the top surface BEt of each of the bottom electrodes BE in a horizontal direction. A side surface of the dielectric layer DL adjacent to the third portion 650 of the top supporting pattern TS and a side surface of the top electrode TE adjacent to the third portion 650 of the top supporting pattern TS may have a stepwise shape, as shown.

FIGS. 5 to 10 are cross-sectional views of intermediate structures, which are taken along the line A-A' of FIG. 1 to illustrate a method of fabricating a semiconductor device according to an embodiment of the inventive concept. Hereinafter, a method of fabricating a semiconductor device, according to an embodiment of the inventive concept, will be described in more detail with reference to FIGS. 1, 2, and 5 through 10.

Figure 5:
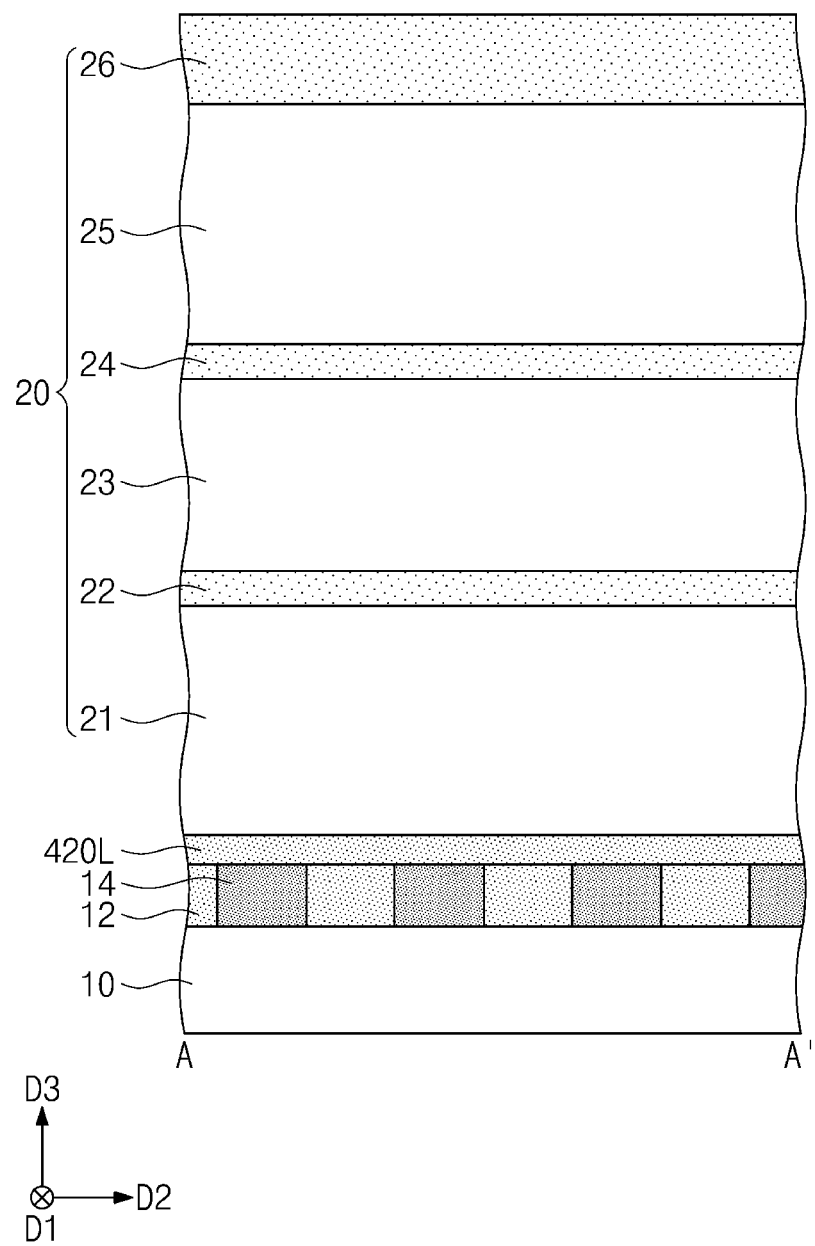
FIGS. 5 to 10 are sectional views, which are taken along the line A-A' of FIG. 1 in to illustrate a method of fabricating a semiconductor device according to an embodiment of the inventive concept.

Referring to FIG. 5, the substrate 10 may be provided. The interlayer insulating layer 12 may be formed on the substrate 10. The conductive contacts 14 may be formed in the interlayer insulating layer 12. An etch stop layer 420L may then be formed to cover a top surface of the interlayer insulating layer 12 and top surfaces of the conductive contacts 14.

A multi-layered mold structure 20 may be formed on the etch stop layer 420L. The mold structure 20 may include mold layers and supporting layers, which are alternately and repeatedly stacked. The formation of the mold structure 20 may include sequentially stacking: a first mold layer 21, a bottom supporting layer 22, a second mold layer 23, a middle supporting layer 24, a third mold layer 25, and a preliminary top supporting layer 26, on the etch stop layer 420L. The bottom supporting layer 22 may be formed of or include a material having an etch selectivity with respect to the first and second mold layers 21 and 23. The middle supporting layer 24 may be formed of or include a material having an etch selectivity with respect to the second and third mold layers 23 and 25. The preliminary top supporting layer 26 may be formed of or include a material having an etch selectivity with respect to the third mold layer 25. Each of the first to third mold layers 21, 23, and 25 may have a single-layered structure (as shown) or a multi-layered structure including a plurality of insulating layers formed of two different materials. The bottom supporting layer 22, the middle supporting layer 24, and the preliminary top supporting layer 26 may be formed of or include at least one of silicon nitride, SiBN, or SiCN, for example.

Figure 6:
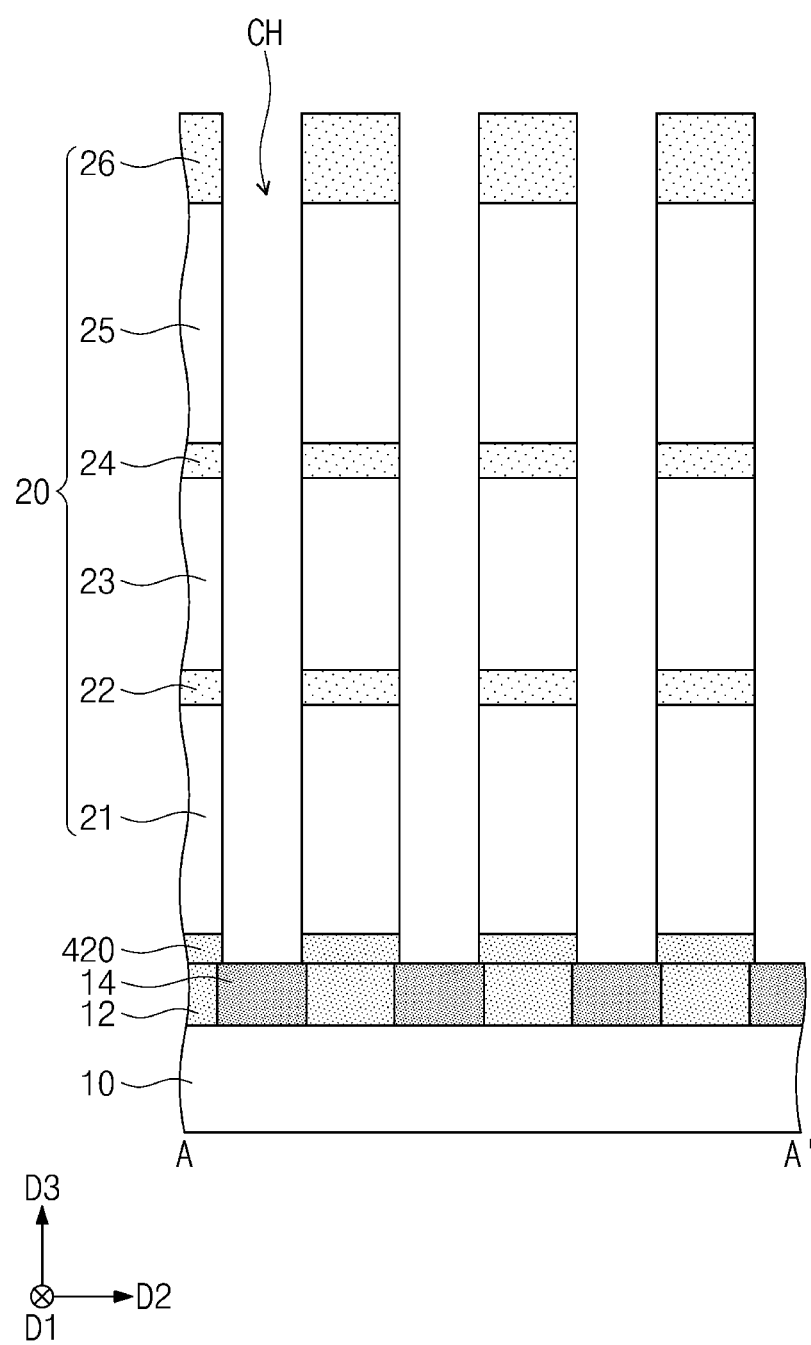

Referring now to FIGS. 5 and 6, the conductive contact holes CH may be formed to penetrate the mold structure 20 and the etch stop layer 420L. The formation of the conductive contact holes CH may include forming a mask pattern (not shown) on the preliminary top supporting layer 26 and anisotropically etching the mold structure 20 and the etch stop layer 420L, using the mask pattern as an etching mask. The conductive contact holes CH may penetrate the mold structure 20 and the etch stop layer 420L in the third direction D3 and may expose the top surfaces of the conductive contacts 14. Hereinafter, a remaining portion of the etch stop layer 420L, which is not removed by the etching process, may be referred to as the etch stop pattern 420.

Figure 7:
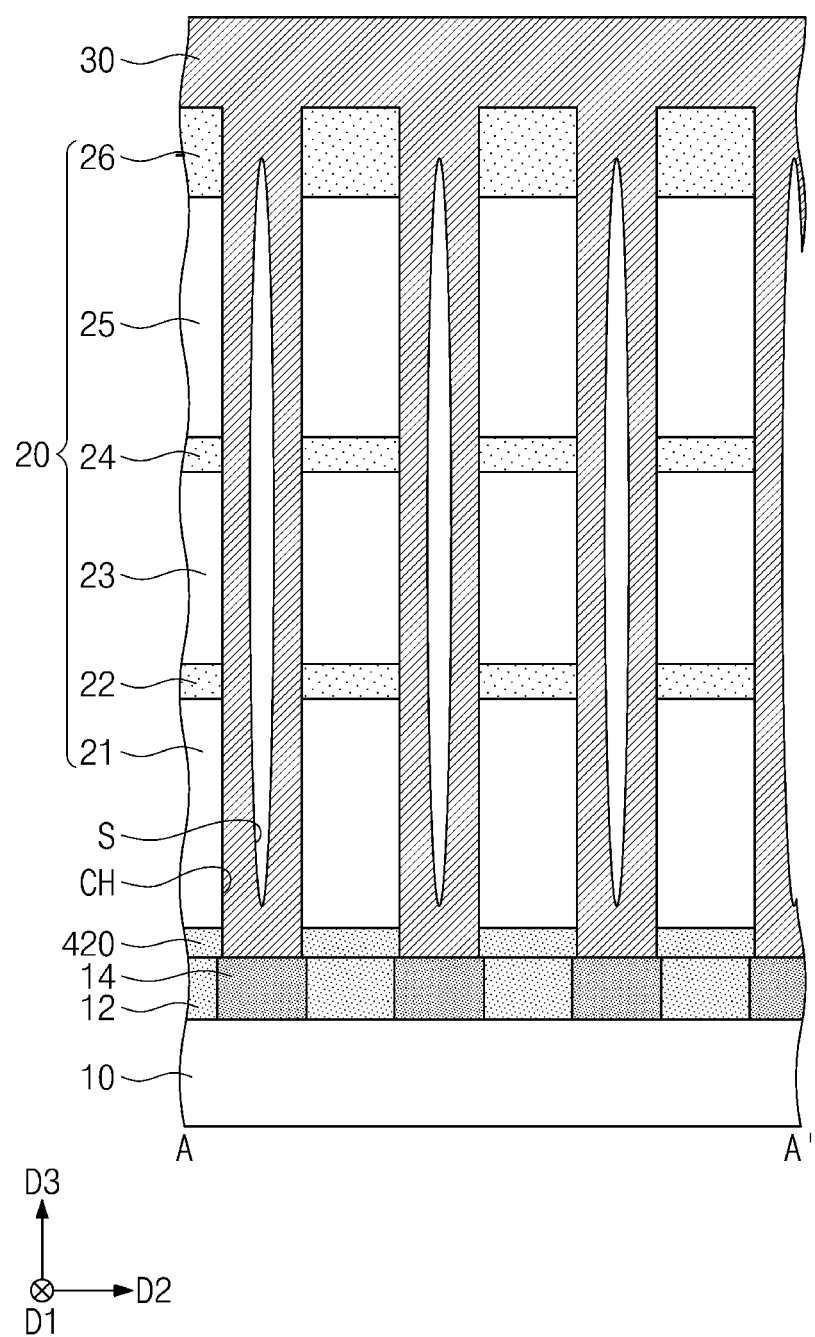

Referring to FIG. 7, a bottom electrode layer 30 may be formed (e.g., conformally deposited) on the mold structure 20 to fill the conductive contact holes CH. The bottom electrode layer 30 may cover the preliminary top supporting layer 26 and the exposed top surfaces of the conductive contacts 14, and line the sidewalls of the conductive contact holes CH.

In the case where the conductive contact holes CH have a relatively high aspect ratio, top entrances of the conductive contact holes CH may be closed while the conductive contact holes CH are not yet filled with the bottom electrode layer 30, and in this case, a seam S (e.g., void, air gap) may be formed in each of the conductive contact holes CH. In an embodiment, the bottom electrode layer 30 may be formed of or include at least one of metallic materials (e.g., cobalt, titanium, nickel, tungsten, and molybdenum), metal nitride materials (e.g., titanium nitride (TiN), titanium silicon nitride (TiSiN), titanium aluminum nitride (TiAlN), tantalum aluminum nitride (TaAlN), and tungsten nitride (WN)), precious metals (e.g., platinum (Pt), ruthenium (Ru), and iridium (Ir)), conductive oxide materials (e.g., PtO, $RuO_2$, $IrO_2$, SRO ($SrRuO_3$), BSRO (($Ba,Sr$)$RuO_3$), CRO ($CaRuO_3$), and LSCo), or metal silicide materials.

Figure 8:
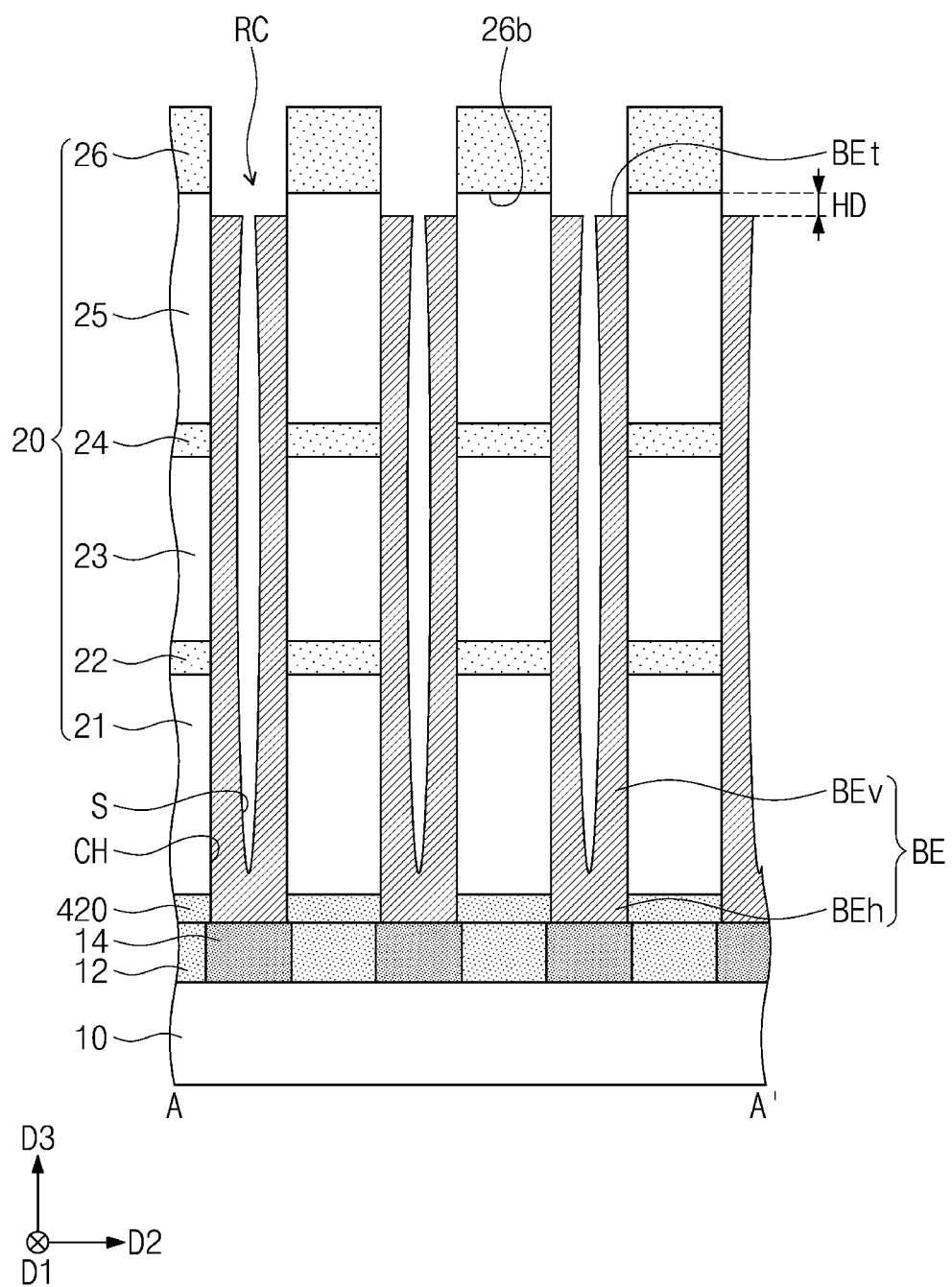

Referring now to FIGS. 7 and 8, the bottom electrodes BE may be formed by removing a portion of the bottom electrode layer 30, and exposing the preliminary top supporting layer 26. In particular, recess portions RC may be defined by side surfaces of the preliminary top supporting layer 26 and the top surface BEt of each of the bottom electrodes BE, so that the seam S in each of the conductive contact holes CH may be exposed by each of the recess portions RC. Thus, as shown, the interior side surfaces of the bottom electrodes BE may be exposed by forming the recess portions RC.

The top surface BEt of each of the bottom electrodes BE exposed through the recess portions RC may be located at a level lower than a bottom surface 26b of the preliminary top supporting layer 26. Nonetheless, the top surface BEt of each of the bottom electrodes BE may be located at a level higher than a top surface of the middle supporting layer 24. In an embodiment, a height difference HD between the top surface BEt of each of the bottom electrodes BE and the bottom surface 26b of the preliminary top supporting layer 26 may range from about 10 Å to about 150 Å.

Figure 9:
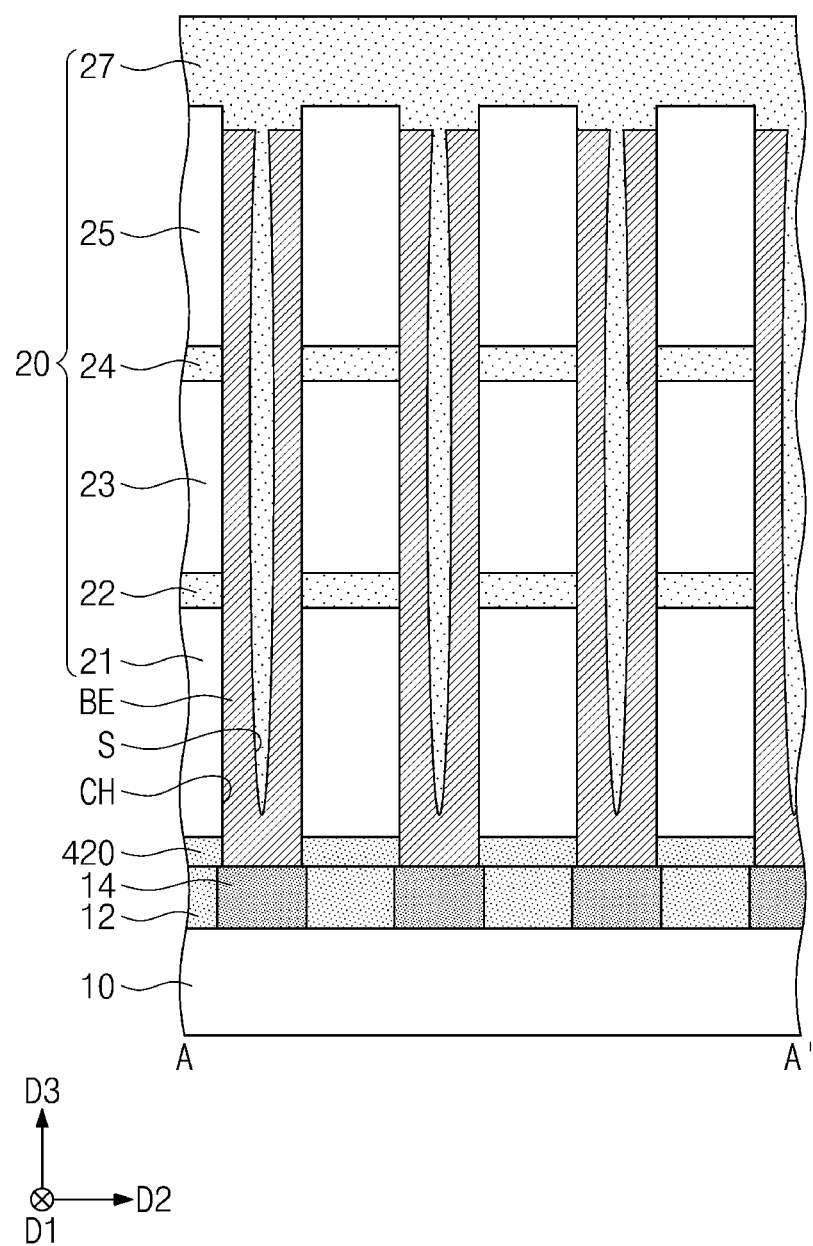

Referring now to FIGS. 8 and 9, a top supporting layer 27 may be formed to completely fill the seams S and the recess portions RC. In some embodiments of the inventive concept, the seams S and the recess portions RC may be filled with the same material as the preliminary top supporting layer 26, as shown.

Figure 10:
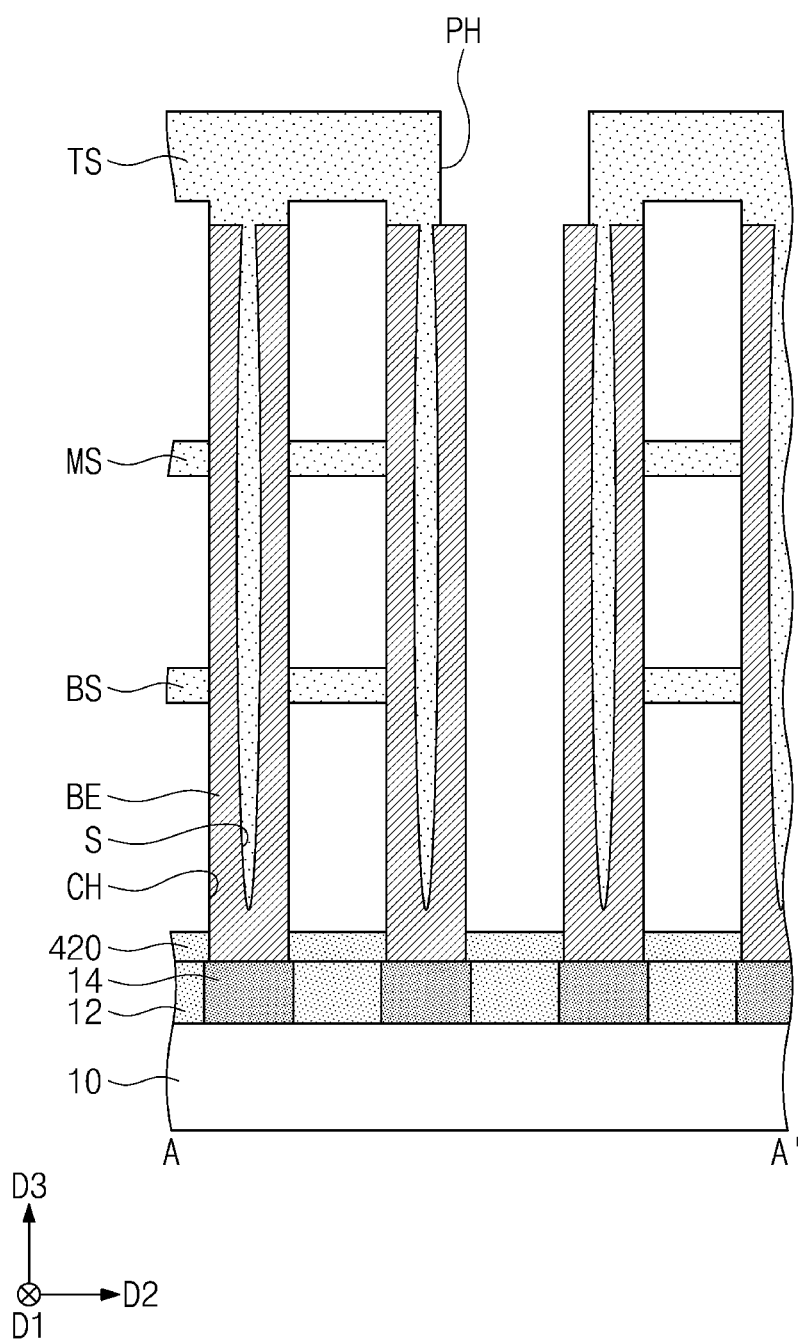

Referring now to FIGS. 9 and 10, the penetration holes PH may be formed to vertically penetrate the full mold structure 20. Each of the penetration holes PH may be formed to expose an outer sidewall of one of the bottom electrodes BE and a top surface of the etch stop pattern 420. Remaining portions of the bottom, middle, and top supporting layers 22, 24, and 27, which are not removed by the process of forming the penetration holes PH, may be used as the bottom, middle, and top supporting patterns BS, MS, and TS, respectively. The first to third mold layers 21, 23, and 25, which are exposed through the penetration holes PH, may be removed by an isotropic etching process (e.g., a wet etching process using phosphoric acid ($H_3PO_4$)); however, the bottom, middle, and top supporting patterns BS, MS, and TS may not be removed by the isotropic etching process.

Referring back to FIGS. 1 and 2, the dielectric layer DL may be formed to conformally cover the top and bottom surfaces of the bottom supporting pattern BS, the top and bottom surfaces of the middle supporting pattern MS, the top, bottom, and side surfaces of the top supporting pattern TS, the top surface of the etch stop pattern 420, and the outer sidewall OSW of each of the bottom electrodes BE. The dielectric layer DL may be formed by a deposition process (e.g., a chemical vapor deposition (CVD) process or an atomic layer deposition (ALD) process) having a good step coverage property.

The top electrode TE may be formed on the dielectric layer DL. The top electrode TE may be formed to fully fill the penetration holes PH and to cover a top surface of the top supporting pattern TS. The top electrode TE may cover at least a portion of the top surface of at least one of the bottom electrodes BE. The top electrode TE may be formed to fill an internal space of each of the penetration holes PH, a space between the etch stop pattern 420 and the bottom supporting pattern BS, a space between the bottom and middle supporting patterns BS and MS, and a space between the middle and top supporting patterns MS and TS.

Figure 11:
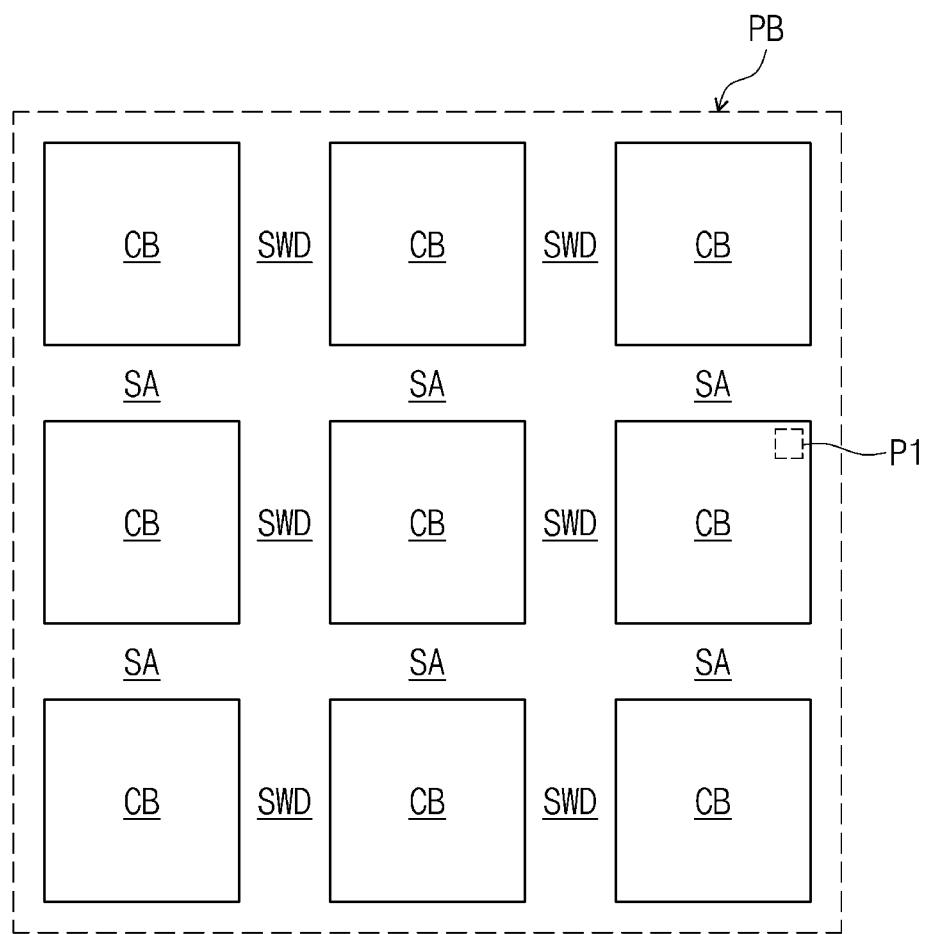
FIG. 11 is a block diagram illustrating a semiconductor device according to an embodiment of the inventive concept.
Figure 12:
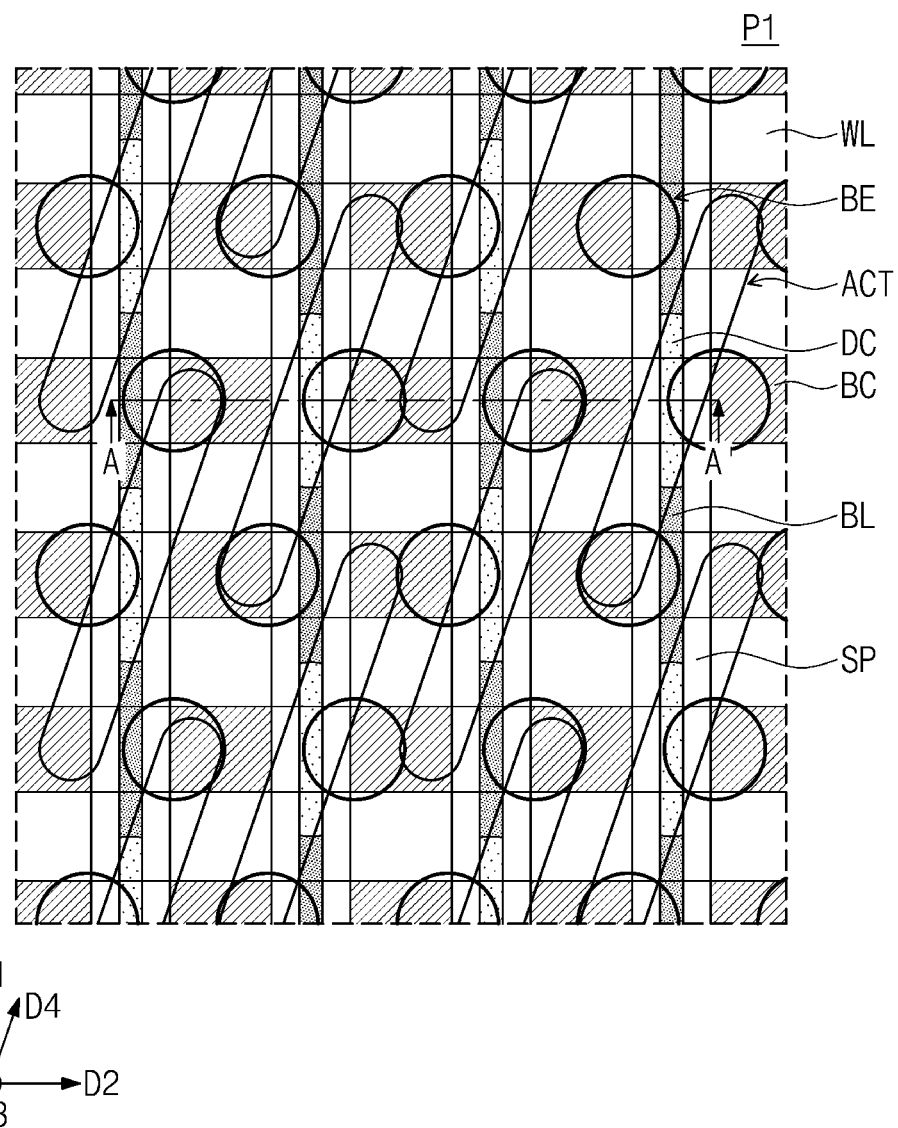
FIG. 12 is an enlarged plan view illustrating a portion (e.g., 'P1' of FIG. 11) of a cell block of a semiconductor device according to an embodiment of the inventive concept.
Figure 13:
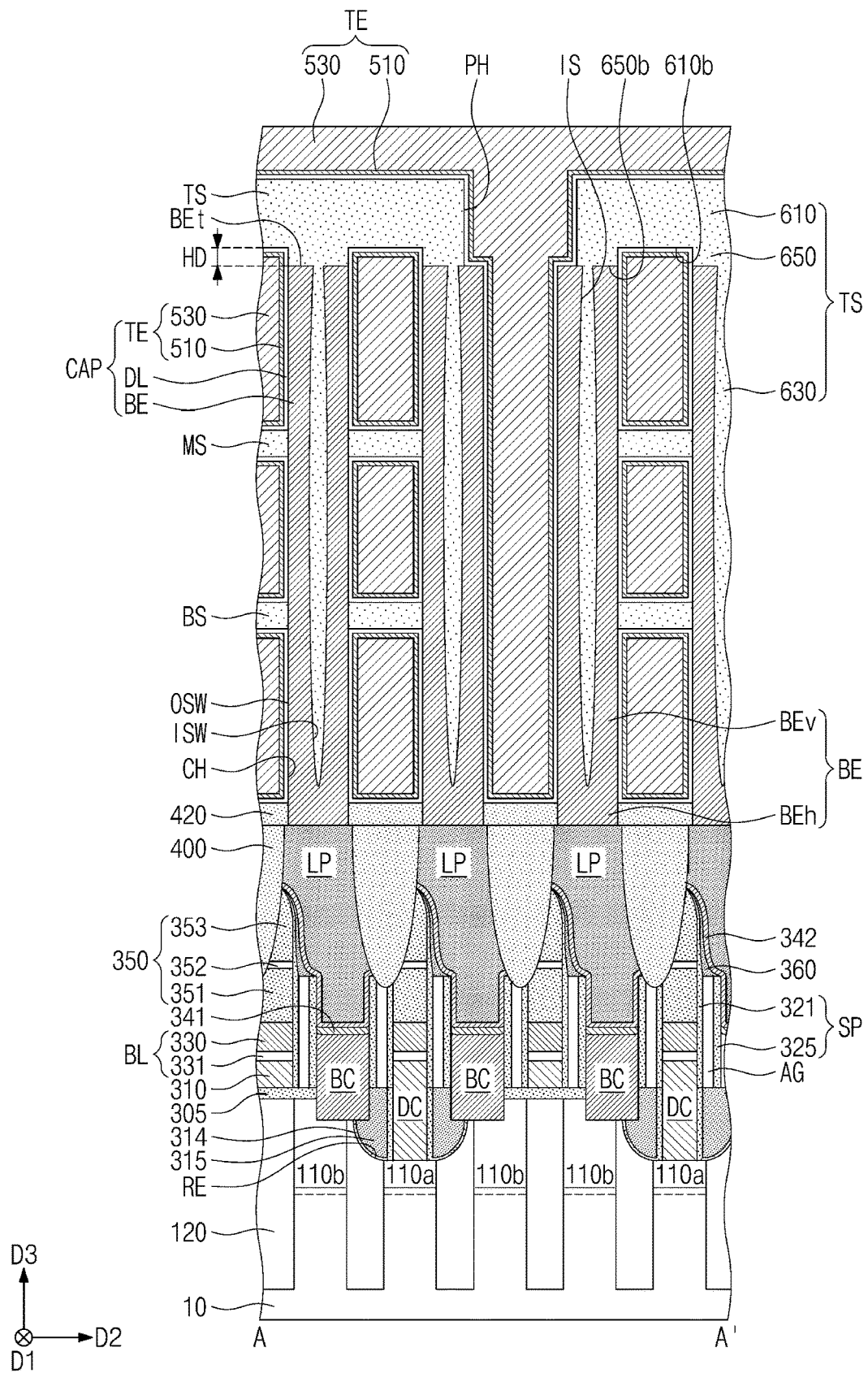
FIG. 13 is a sectional view, which is taken along a line A-A' of FIG. 12 to illustrate a semiconductor device according to an embodiment of the inventive concept.

FIG. 11 is a block diagram illustrating a semiconductor device according to an embodiment of the inventive concept. FIG. 12 is an enlarged plan view illustrating a portion (e.g., 'P1' of FIG. 11) of a cell block of a semiconductor device according to an embodiment of the inventive concept. FIG. 13 is a sectional view, which is taken along a line A-A' of FIG. 12 to illustrate a semiconductor device according to an embodiment of the inventive concept.

Referring to FIG. 11, a semiconductor device may include cell blocks CB and a peripheral block PB, which is provided to surround each of the cell blocks CB. The semiconductor device may be a memory device, and each of the cell blocks CB may include a cell circuit (e.g., a memory integrated circuit). The cell blocks CB may be spaced apart from each other in the first and second directions D1 and D2, which are non-parallel (e.g., orthogonal) to each other.

The peripheral block PB may include various peripheral circuits, which are used to operate the cell circuit, and the peripheral circuits may be electrically connected to the cell circuit. The peripheral block PB may include sense amplifier circuits SA and sub-word line driver circuits SWD. In an embodiment, the sense amplifier circuits SA may be provided to face each other with the cell blocks CB interposed therebetween, and the sub-word line driver circuits SWD may be provided to face each other with the cell blocks CB interposed therebetween. The peripheral block PB may further include power and ground circuits for driving a sense amplifier, but the inventive concept is not limited to this example.

Referring to FIGS. 12 and 13, the substrate 10 including a cell region may be provided. The cell region may be a region of the substrate 10, in which each of the cell blocks CB of FIG. 11 is provided. In an embodiment, the substrate 10 may be a silicon substrate, a germanium substrate, or a silicon-germanium substrate.

Active patterns ACT may be provided on the cell region of the substrate 10. When viewed in a plan view, the active patterns ACT may be spaced apart from each other in the first and second directions D1 and D2. The active patterns ACT may be bar-shaped patterns extended in a fourth direction D4 that is parallel to the top surface of the substrate 10 and is inclined to the first and second directions D1 and D2. An end portion of one of the active patterns ACT may be placed near a center of another active pattern ACT adjacent thereto in the second direction D2. Each of the active patterns ACT may be a protruding portion of the substrate 10 that is extended from the substrate 10 in the third direction D3.

A device isolation layer 120 may be provided between the active patterns ACT. The device isolation layer 120 may be provided in the substrate 10 to define the active patterns ACT. The device isolation layer 120 may be formed of, or include, at least one of silicon oxide, silicon nitride, and/or silicon oxynitride.

Word lines WL may be provided in the substrate 10 to cross the active patterns ACT and the device isolation layer 120. The word lines WL may be provided in grooves, which are formed in the active patterns ACT and the device isolation layer 120. The word lines WL may be extended in the second direction D2 and may be spaced apart from each other in the first direction D1. The word lines WL may be buried in the substrate 10.

Impurity regions may be provided in the active patterns ACT. The impurity regions may include first impurity regions 110a and second impurity regions 110b. The second impurity regions 110b may be respectively provided in opposite ends of each of the active patterns ACT. Each of the first impurity regions 110a may be provided in a portion (e.g., between the second impurity regions 110b) of a corresponding one of the active patterns ACT. The first and second impurity regions 110a and 110b may contain impurities of the same conductivity type (e.g., n-type).

A buffer pattern 305 may be provided on the cell region of the substrate 10. The buffer pattern 305 may cover the active patterns ACT, the device isolation layer 120, and the word lines WL. The buffer pattern 305 may be formed of or include at least one of silicon oxide, silicon nitride, and/or silicon oxynitride.

Bit lines BL may be provided on the substrate 10. The bit lines BL may be extended in the first direction D1 and may be spaced apart from each other in the second direction D2. Each of the bit lines BL may include a first ohmic pattern 331 and a metal-containing pattern 330, which are sequentially stacked. The first ohmic pattern 331 may be formed of or include at least one of metal silicide materials. The metal-containing pattern 330 may be formed of or include at least one of metallic materials (e.g., tungsten, titanium, and tantalum). In addition, polysilicon patterns 310 may be interposed between the bit lines BL and the buffer pattern 305.

Bit line contacts DC may be respectively interposed between the bit lines BL and the first impurity regions 110a. The bit lines BL may be electrically connected to the first impurity regions 110a through the bit line contacts DC. In an embodiment, the bit line contacts DC may be formed of or include doped or undoped polysilicon.

The bit line contacts DC may be provided in a recess region RE. The recess region RE may be provided in upper portions of the first impurity region 110a and the device isolation layer 120, which are adjacent to each other. A first gapfill insulating pattern 314 and a second gapfill insulating pattern 315 may be provided to fill a remaining portion of the recess region RE.

A bit line capping pattern 350 may be provided on a top surface of each of the bit lines BL. The bit line capping pattern 350 may be extended in the first direction D1 and may be spaced apart from another bit line capping pattern 350 in the second direction D2. The bit line capping pattern 350 may include: (i) a first bit line capping pattern 351, (ii) a second bit line capping pattern 352, and (iii) a third bit line capping pattern 353, as shown by FIG. 13. The bit line capping pattern 350 may be formed of or include silicon nitride. For example, the first, second, and third bit line capping patterns 351, 352, and 353 may be formed of or include silicon nitride.

A bit line spacer SP may be provided to cover a side surface of each of the polysilicon patterns 310, an upper side surface of each of the bit line contacts DC, a side surface of each of the bit lines BL, and a side surface of the bit line capping pattern 350. On each of the bit lines BL, the bit line spacer SP may be extended in the first direction D1.

The bit line spacer SP may include a first sub-spacer 321 and a second sub-spacer 325, which are spaced apart from each other. For example, the first and second sub-spacers 321 and 325 may be spaced apart from each other by an air gap AG. The first sub-spacer 321 may be in contact with the side surface of each of the bit lines BL and may be extended to the side surface of the bit line capping pattern 350. The second sub-spacer 325 may be provided along a side surface of the first sub-spacer 321. The first and second sub-spacers 321 and 325 may be formed of or include at least one of silicon nitride, silicon oxide, or silicon oxynitride and may have a single- or multi-layered structure. The first and second sub-spacers 321 and 325 may be formed of or include the same material.

A fourth capping pattern 360 may be provided to cover the side surface of the first sub-spacer 321 and may be extended to a top surface of the second sub-spacer 325. The fourth capping pattern 360 may cover the air gap AG.

Storage node contacts BC may be provided on the substrate 10 to be interposed between adjacent ones of the bit lines BL. The bit line spacer SP may be interposed between the storage node contacts BC and the bit lines BL adjacent thereto. The storage node contacts BC may be spaced apart from each other in the first and second directions D1 and D2. Each of the storage node contacts BC may be electrically connected to a corresponding one of the second impurity regions 110b. The storage node contacts BC may be formed of or include doped or undoped poly silicon.

A second ohmic pattern 341 may be provided on each of the storage node contacts BC. The second ohmic pattern 341 may be formed of or include at least one of metal silicide materials. A diffusion prevention pattern 342 may be provided to conformally cover the second ohmic pattern 341, the bit line spacer SP, and the bit line capping pattern 350. The diffusion prevention pattern 342 may be formed of or include at least one of metal nitride materials (e.g., titanium nitride (TiN) and tantalum nitride (TaN)). The second ohmic pattern 341 may be interposed between the diffusion prevention pattern 342 and each of the storage node contacts BC.

Landing pads LP may be provided on the storage node contacts BC, respectively. Each of the landing pads LP may be electrically connected to a corresponding one of the storage node contacts BC. The landing pads LP may be formed of or include a metal-containing material (e.g., tungsten (W)). An upper portion of the landing pad LP may be shifted from the storage node contact BC in the second direction D2. When viewed in a plan view, the landing pads LP may be spaced apart from each other in the first and second directions D1 and D2. As an example, the landing pads LP may be spaced apart from each other in the first and second directions D1 and D2 or may be arranged in a zigzag shape. The landing pads LP may correspond to the conductive contacts 14 of FIG. 2.

A filling pattern 400 may be provided to enclose each of the landing pads LP. The filling pattern 400 may be interposed between adjacent ones of the landing pads LP. The filling pattern 400 may be formed of, or include, at least one of silicon nitride, silicon oxide, or silicon oxynitride. In an embodiment, the filling pattern 400 may be an empty space. The filling pattern 400 may correspond to the interlayer insulating layer 12 of FIG. 2.

The etch stop pattern 420 may be provided on the filling pattern 400. The etch stop pattern 420 may be provided to expose top surfaces of the landing pads LP, and the bottom electrodes BE may be provided on the top surfaces of the landing pads LP, respectively. Each of the bottom electrodes BE may be electrically connected to a corresponding one of the landing pads LP.

At least one supporting pattern may be provided on the substrate 10. The supporting pattern may include the bottom, middle, and top supporting patterns BS, MS, and TS, which are spaced apart from each other in the third direction D3. When viewed in a plan view, the supporting pattern may be interposed between adjacent ones of the bottom electrodes BE. The top electrode TE may be provided to cover the bottom electrodes BE and the supporting pattern. The dielectric layer DL may be interposed between the bottom electrodes BE and the top electrode TE and between the supporting pattern and the top electrode TE. The bottom electrodes BE, the dielectric layer DL, and the top electrode TE may constitute the capacitor CAP.

The etch stop pattern 420, the bottom electrodes BE, the bottom supporting pattern BS, the middle supporting pattern MS, the top supporting pattern TS, the dielectric layer DL and the top electrode TE may be configured to have substantially the same features as those described with reference to FIGS. 1 and 2.

According to an embodiment of the inventive concept, bottom electrodes may be physically supported by a plurality of supporting patterns, which are located at different levels.

Furthermore, in a method of fabricating a semiconductor device according to an embodiment of the inventive concept, by recessing a bottom electrode layer to a level lower than a bottom surface of a top supporting pattern, it may be possible to prevent the bottom electrodes from interfering with each other. In addition, by omitting a process of depositing an additional insulating layer on a side surface of the top supporting pattern, it may be possible to simplify a fabrication process and to reduce a process variation. As a result, it may be possible to reduce failures in a capacitor structure of a semiconductor device (e.g., memory device) and thereby to improve electrical and reliability characteristics of the semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
   bottom electrodes on a substrate;
   a bottom supporting pattern extending between the bottom electrodes;
   a top supporting pattern on the bottom electrodes, said top supporting pattern including a first portion, which is provided on top surfaces of the bottom electrodes, and a second portion, which is provided to fill an internal space within each of the bottom electrodes;
   a top electrode covering the bottom electrodes, the bottom supporting pattern, and the top supporting pattern; and
   a dielectric layer interposed between the bottom electrodes and the top electrode, between the bottom supporting pattern and the top electrode, and between the top supporting pattern and the top electrode.

2. The device of claim 1, wherein the top supporting pattern further includes a third portion between the first portion and the second portion; and wherein a side surface of the third portion is aligned to an outer sidewall of each of the bottom electrodes.

3. The device of claim 2, wherein a width of the third portion is smaller than or equal to an upper width of each of the bottom electrodes.

4. The device of claim 2, wherein the top surfaces of the bottom electrodes are located at a level lower than a bottom surface of the first portion.

5. The device of claim 4, wherein a height difference between the top surfaces of the bottom electrodes and the bottom surface of the first portion ranges from about 10 Å to about 150 Å.

6. The device of claim 2, wherein a thickness of the third portion is smaller than a thickness of the first portion.

7. The device of claim 1, wherein the top surfaces of the bottom electrodes are located at the same level as a bottom surface of the first portion.

8. The device of claim 1, wherein the top supporting pattern further comprises a third portion between the first portion and the second portion; and wherein a side surface of the third portion is spaced apart from an outer sidewall of each of the bottom electrodes.

9. The device of claim 8, wherein a width of the third portion is larger than an upper width of each of the bottom electrodes.

10. The device of claim 1, wherein as a distance from the substrate increases, a width of the second portion increases and then decreases.

11. The device of claim 1, wherein the second portion is overlapped with the bottom supporting pattern in a horizontal direction.

12. The device of claim 1, wherein each of the top surfaces of the bottom electrodes has a doughnut shape when viewed from a plan perspective relative to a surface of the substrate.

13. The device of claim 1, further comprising a middle supporting pattern extending between the bottom supporting pattern and the top supporting pattern.

14. The device of claim 13, wherein the bottom supporting pattern and the middle supporting pattern enclose and contact an outer sidewall of each of the bottom electrodes.

15. A semiconductor device, comprising:
bottom electrodes on a substrate;
a bottom supporting pattern extending between the bottom electrodes;
a top supporting pattern on the bottom electrodes;
a top electrode covering the bottom electrodes, the bottom supporting pattern, and the top supporting pattern; and
a dielectric layer extending between the bottom electrodes and the top electrode, between the bottom supporting pattern and the top electrode, and between the top supporting pattern and the top electrode;
wherein each of the bottom electrodes includes a horizontal portion and a vertical portion, which is vertically extended from the horizontal portion;
wherein the horizontal portion and the vertical portion define an internal space of each of the bottom electrodes;
wherein the top supporting pattern covers top surfaces of the bottom electrodes; and
wherein at least a portion of the top supporting pattern extends into the internal space of each of the bottom electrodes.

16. The device of claim 15, wherein the horizontal portion is located at a level lower than the bottom supporting pattern.

17. The device of claim 15, wherein the bottom supporting pattern and the top supporting pattern comprise at least one material selected from a group consisting of silicon nitride, SiBN, and SiCN.

18. The device of claim 15, wherein a side surface of the dielectric layer adjacent to the top supporting pattern and a side surface of the top electrode adjacent the top supporting pattern have a stepwise shape.

19. A semiconductor device, comprising:
a substrate having an active pattern therein;
an impurity region within the active pattern;
a word line that crosses the active pattern;
a bit line that crosses the word line;
a storage node contact electrically connected to the impurity region;
a landing pad electrically connected to the storage node contact;
a bottom electrode electrically connected to the landing pad;
a bottom supporting pattern and a top supporting pattern, which are provided between the bottom electrode and another bottom electrode adjacent thereto, when viewed from a plan perspective;
a top electrode covering the bottom electrode, the bottom supporting pattern, and the top supporting pattern; and
a dielectric layer extending between the bottom electrode and the top electrode, between the bottom supporting pattern and the top electrode, and between the top supporting pattern and the top electrode; and
wherein the top supporting pattern includes a first portion on a top surface of the bottom electrode and a second portion that fills an internal space within the bottom electrode.

20. The device of claim 19,
wherein the top supporting pattern further includes a third portion extending between the first portion and the second portion;
wherein a side surface of the third portion is aligned to an outer sidewall of the bottom electrode; and
wherein a top surface of the bottom electrode is located at a level lower than a bottom surface of the first portion.

* * * * *